United States Patent [19]

Kondo et al.

[11] Patent Number: 4,904,568

[45] Date of Patent: Feb. 27, 1990

[54] METHOD OF FORMING PRINTED IMAGE

[75] Inventors: Koshio Kondo; Koji Takezoe, both of Hiratsuka, Japan

[73] Assignee: Kansai Paint Co., Ltd., Amagasaki, Japan

[21] Appl. No.: 219,443

[22] Filed: Jul. 14, 1988

[30] Foreign Application Priority Data

Jul. 15, 1987 [JP] Japan .................................. 62-176659

[51] Int. Cl.[4] .................................................. G03C 5/00
[52] U.S. Cl. .................................... 430/294; 430/145; 430/319; 430/325; 430/327; 204/18.1
[58] Field of Search ............... 430/145, 144, 319, 146, 430/294, 293, 327, 292, 325, 311, 322, 9; 204/6, 14.1, 17, 18.1, 20, 15, 35.1, 23

[56] References Cited

U.S. PATENT DOCUMENTS

| | | | |
|---|---|---|---|
| 4,190,446 | 2/1980 | Martin et al. | 430/292 |
| 4,374,193 | 2/1983 | Moriya et al. | 430/149 |
| 4,376,158 | 3/1983 | Spechler | 430/293 |
| 4,522,691 | 6/1985 | Suginoya et al. | 204/18.1 |
| 4,592,816 | 6/1986 | Emmons et al. | 204/180.6 |
| 4,632,900 | 12/1986 | Demmer et al. | 430/323 |
| 4,671,854 | 6/1987 | Ishikawa et al. | 156/659 |
| 4,673,458 | 6/1987 | Ishikawa et al. | 430/318 |
| 4,704,347 | 11/1987 | Vollenbroek et al. | 430/273 |
| 4,751,172 | 6/1988 | Rodriguez et al. | 430/314 |

Primary Examiner—Jose G. Dees
Assistant Examiner—Donald S. Loney
Attorney, Agent, or Firm—Fisher, Christen & Sabol

[57] ABSTRACT

Disclosed is a method of forming a printed image, which method comprises coating an electrodeposition coating composition on a plate with a conductive film and for use in a printed circuit to form a photo-sensitive resist film, and exposing the photo-sensitive resist film to light through a pattern mask, followed by development, the surface of said photo-sensitive resist film being colored with a dye.

20 Claims, No Drawings

METHOD OF FORMING PRINTED IMAGE

BACKGROUND OF THE INVENTION (1) Field of the Invention

The present invention relates to a method of forming printed images, and particularly to the method of forming printed images in which a photo-sensitive resist film formed on a surface of a copper-clad laminated plate for use in a printed circuit (hereinafter referred to as a copper-clad laminated plate) is colored with a dye.

(2) Description of the Prior Art

The printed-circuit board has conventionally been prepared for a long period of time by a process which comprises forming a photo-sensitive resist film on the surface of a copper foil of the copper-clad laminated plate, exposing the resist film to light through a desired pattern mask, followed by applying a developing treatment to obtain a resist film pattern, and applying etching onto the surface of an exposed copper foil to obtain a desired circuit pattern.

The conventional method of forming the photo-sensitive resist film on the copper foil on the surface of the copper-clad laminated plate includes a method of coating a liquid resist material by use of the conventional coating process such as dipping, roller coating, centrifugal coating and the like, a method of laminating a film-shaped photo-sensitive film called the dry film, for example, Riston film marketed by Du Pont de Nemours & Co. by use of the exclusive sticker, and the like. Recently, however, in place of the above conventional methods, there has been proposed a method of forming the photo-sensitive resist film which comprises coating a photo-curable electrodeposition coating composition.

The method of forming the photo-sensitive resist film by coating the photo-curable electrodeposition coating composition on the copper foil on the surface of the copper-clad laminated plate has such advantages as to be capable of uniformly coating without loss of the starting material and of being incorporated into an automatic line.

However, the aforementioned method raises such a problem that in the case where the photo-sensitive electrodeposition resist film obtained by the aforementioned method has been subjected to exposure to light and to development, it is difficult to judge whether or not the developed printed image has actually been formed as an intended printed image, because the resist film is usually colorless and transparent.

In order to solve the above problems, it is considered to color the resist film, but coloring the resist film requires to disperse and dissolve a coloring pigment or dye in the coating composition, resulting in that the photo-sensitive film formed by use of such an electrodeposition coating composition may cause troubles such as reduction in permeability to ultraviolet light, occurrence of seeds due to deposition of the pigment or dye, gelation of the electrodeposition coating composition due to reaction between the resin and the pigment or dye, disintegration of the emulsion, abnormality of deposition of the electrodeposition coating film, and the like.

SUMMARY OF THE INVENTION

It is an object of the present invention to provide a method of forming a printed image, which method comprises coating an electrodeposition coating composition on a plate with a conductive film and for use in a printed circuit to form a photo-sensitive resist film, and exposing the photo-sensitive resist film to light through a pattern mask, followed by development and makes it possible to judge without fail whether or not the developed printed image has actually been formed as an intended printed image without giving any adverse effect on the resist film in a simple manner, and consequently is applicable to the preparation of the printed-circuit board to prevent beforehand any defectives which would otherwise be found after the printed-circuit board has been prepared.

The present invention provides a method of forming a printed image, which method comprises coating an electrodeposition coating composition on a plate with a conductive film and for use in a printed circuit to form a photo-sensitive resist film, and exposing the photo-sensitive resist film to light through a pattern mask, followed by development, the surface of said photo-sensitive resist film being colored with a dye.

DETAILED DESCRIPTION OF THE INVENTION

The photo-curable electrodeposition coating composition used for the formation of the photo-sensitive resist film in the present invention may be the anionic or cationic electrodeposition coating composition. The photo-curable anionic electrodeposition coating composition is composed of the conventional photo-curable composition (e.g. U.S. Pat. Nos. 3,954,587 and 4,592,816), which comprises (i) a water soluble or water dispersible, polymerizable unsaturated resin having an acid value of 20 to 300, particularly 40 to 110, an unsaturation equivalent of about 150 to about 3,000 and a number average molecular weight of about 300 or more, particularly 1,000 to 30,000, and having an ethylenically unsaturated bond polymerizable by an actinic ray, and (ii) a water-insoluble photopolymerization initiator.

Examples of the basic resin constituting a basic skeleton of the polymerizable unsaturated resin include acrylic resin, urethane resin, epoxy resin, polyester resin, polyether resin, alkyd resin, polyvinyl chloride, fluorocarbon resin, silicone resin, polyvinyl acetate, polyvinyl alcohol, and the like.

The film-forming resin constituting the photo-curable cationic electrodeposition coating composition used in the present invention is the conventional resin containing an ethylenically unsaturated group such as acryloyl group, methacryloyl group or the like and amino group. As to the amino group, tertiary amino group is preferred, because primary and secondary amino groups are easily subjected to addition reaction with the ethylenically unsaturated group and have poor storage properties.

Examples of the resin containing the ethylenically unsaturated group and amino group include (1) a resin prepared by addition of primary or secondary amine to the epoxy compound followed by addition of an isocyanate compound containing the ethylenically unsaturated group to hydroxide group; (2) a resin prepared by addition of a compound containing the ethylenically unsaturated group and carboxyl group to the epoxy group of a resin containing epoxy group and tertiary amino group; and (3) a resin prepared by addition of primary amine to a monoepoxy compound for secondary amination, followed by addition of a diepoxy compound or a polyepoxy compound in such an amount that a ratio of a number of equivalents between the secondary amine and epoxy group may be 1 to 2 or higher, and by the addition of the compound containing the ethylenically unsaturated group and carboxyl group to the remaining epoxy group, or prepared by addition of the isocyanate compound containing the ethylenically unsaturated group to hydroxide group.

The photo-curable cationic electrodeposition coating composition used in the present invention contains, as the major components, a resin component made water-soluble or water-dispersible by neutralization (0.1–1.0 equivalent) of the cationic resin selected from the aforementioned (1) to (3) with an acid such as acetic acid, lactic acid, phosphoric acid or the like, and a water-insoluble photopolymerization initiator component.

Examples of the water-insoluble photopolymerization initiator incorporated in the photo-curable electrodeposition coating composition may include benzoin, benzoin methyl ether, benzoin ethyl ether, benzyl, diphenyl disulfide, tetramethylthiuram monosulfide, Eosine, Thionine, diacetyl, Michler's ketone, anthraquinone, α-hydroxyisobutylphenone, p-isopropyl-α-hydroxyisobutylphenone, α,α'-dichloro-4-phenoxyacetophenone, 1-hydroxy-1-cyclohexylacetophenone, 2,2-dimethoxy-2-phenylacetophenone, methylbenzoyl formate, 2-methyl-1-[4-(methylthio)phenyl]-2-morpholinopropene, thioxanthone, benzophenone, and the like. The above photopolymerization initiator may be used in an amount of 0.1 to 10 parts by weight per 100 parts by weight of the resin component (as solids).

The electrodeposition coating on the copper-clad laminated plate in the present invention is carried out in such a manner that an electrodeposition coating bath composed of the aforementioned electrodeposition coating composition is controlled under the conditions of pH 6.5 to 9 for the anionic electrodeposition coating composition or pH 3 to 7 for the cationic electrodeposition coating composition. The bath has a solids concentration of 3 to 25% by weight, preferably 5 to 20% by weight, and a bath temperature of 15° to 40° C., preferably 15° to 30° C. The copper-clad laminated plate as an anode for the anionic electrodeposition coating composition or is a cathode for the cationic electrodeposition coating composition. The copper clad laminated plate is then dipped into the controlled electrodeposition coating bath to apply a direct current under 40 to 400 V for suitably 30 seconds to 5 minutes. The formed film thickness is 5 to 100 μm, preferably 10 to 60 μm as the dry film. After the completion of the electrodeposition coating, the coated product is taken out of the electrodeposition coating bath to be washed with water.

The surface of the photo-curable electrodeposition coating film, i.e. the photo-sensitive resist film thus obtained in the present invention is colored with a dye. The types of the dyes used may be of the conventional water-soluble and oil-soluble dyes. Examples of the dyes include, according to the structural classification of the dye, (I) azo dye, (II) anthraquinone dye, (III) indigoid dye, (IV) magenta dye, (V) sulfide dye, (VI) carbonium dye, (VII) quinoneimine dye, (VIII) phthalocyanine dye, and the like.

Of these, the magenta dye, quinoneimine dye and phthalocyanine dye are preferred because of easiness of coloring the electrodeposition coating film. Colors used for coloring are selected from blue or green color because of the easy comparison with the color of the copper-clad laminated plate. The concentration of the dye used may be in the range of from 0.001% to 10% by weight, preferably 0.01% to 5% by weight. A concentration lower than 0.001% by weight makes it difficult to discriminate the color colored therewith, and a concentration higher than 10% by weight results in excessive coloring due to excessive concentration.

The dye may be coated on the photo-sensitive resist film immediately after the formation of the photo-curable electrodeposition coating film by the conventional coating means such as brushing, dip coating, flow coating and the like, may be coated after exposing the electrodeposition coating film to light, may be coated as a developing solution to which the dye is added after exposure to light, or may be coated after the completion of the developing step. From the standpoint of working efficiency, it is advantageous to color the surface of the photo-sensitive resist film during the developing step by use of the developing solution to which the dye is added. In any case, it is possible to easily and without fail judge whether or not the resist film has accurately been formed even for such a fine pattern as to be 75 μm in line width and 75 μm in space width.

In accordance with the method of forming the printed image, the photo-sensitive resist film or the exposed resist film obtained by coloring the surface of the photo-curable electrodeposition coating film formed on the copper-clad laminated plate is such that the method of the present invention makes it possible to judge without fail whether or not the developed printed image has actually been formed as an intended printed image without giving any adverse effect on the resist film in a simple manner, and consequently is applicable to the preparation of the printed-circuit board to prevent beforehand all defectives which would otherwise be found after the printed-circuit board has been prepared.

The present invention is explained more in detail by the following Examples and Comparative Example.

PREPARATION OF PHOTO-CURABLE RESIN SOLUTION

A mixture of 40 parts by weight of methylmethacrylate, 40 parts by weight of butylacrylate, 20 parts by weight of acrylic acid and 2 parts by weight of azobisisobutyronitrile is dropped into 90 parts by weight of propylene glycol monomethyl ether as a hydrophilic solvent kept at 110° C. under nitrogen atmosphere over 3 hours, followed by aging for one hour, dropping a mixed solution of one part by weight of azobisdimethylvaleronitrile and 10 parts by weight of propylene glycol monomethyl ether over one hour, and by aging for 5 hours to obtain an acrylic resin solution having a high acid value of 155. Thereafter, to the above acrylic resin solution are added 24 parts by weight of glycidyl methacrylate, 0.12 part by weight of hydroquinone and 0.6 part by weight of tetraethylammonium bromide to be reacted at 110° C. for 5 hours blowing air thereinto, resulting in obtaining a solution of an unsaturated photo-curable resin having an acid value of about 50, a degree of unsaturation of 1.35 moles/kg, a Tg of 20° C., and a number average molecular weight of about 20,000.

EXAMPLE 1

To 227 parts by weight of the above photo-curable resin solution is added 6.7 parts by weight of triethylamine to be sufficiently neutralized, followed by adding 6 parts by weight of α-hydroxyisobutylphenone as the photopolymerization initiator, and by adding deionized water in such an amount that the solids content may be 14% by weight to obtain an electrodeposition coating bath having pH 7.0. Electrodeposition coating is carried out by use of the electrodeposition coating bath and, as an anode, a copper-clad laminated plate (50×1,000×1.5 mm) for a printed-circuit board, and by applying a direct current under 420 V for 3 minutes at a bath temperature of 25° C. The above coated film is washed with water and dried at 70° C. for 10 minutes to obtain a smooth photo-sensitive film having a thickness of 25μ.

Thereafter, a circuit pattern having a line width of 75 μm and a space width of 100 μm is set on the photo-sensitive film to be exposed to ultraviolet light irradiated in an irradiation dose of 100 mj/cm² by use of an ultra-high pressure mercury-vapor lamp. Next, the exposed resist film is developed by use of a developing solution colored by adding 0.1% of a water-soluble copper phthalocyanine dye to an aqueous solution of 1% $Na_2CO_3$ to obtain a copper-clad laminated plate having a colored, developed pattern.

In the same manner as above, 200 plates are prepared to be subjected to the following tests.

As the results of the visual circuit tests for 200 plates, 5 defective plates are found. On the other hand, the 200 plates are subjected to a circuit test with the same result that 5 defective plates are found, and that the results of the visual test coincide with those of the circuit test.

COMPARATIVE EXAMPLE 1

In the same manner as in Example 1 except that the developing solution is not colored, 200 plates are prepared. As the results of the visual circuit test, 2 defectives are found. On the other hand, as the results of the circuit test, 4 defectives are found. Comparison of the former results with those of the latter shows that if the resist film is not colored, defectives are overlooked in the case of the visual circuit test.

EXAMPLE 2

To 227 parts by weight of the above photo-curable resin solution is added 6.7 parts by weight of triethylamine to be sufficiently neutralized, followed by adding 6 parts by weight of α-hydroxyisobutylphenone as the photopolymerization initiator, and by adding deionized water in such an amount that the solids content may be 14% by weight to obtain an electrodeposition coating bath having pH 7.0. Electrodeposition coating is carried out by use of the electrodeposition coating bath and, as an anode, a copper-clad laminated plate (50×1,000×1.5 mm) for a printed-circuit board, and by applying a direct current under 120 V for 3 minutes at a bath temperature of 25° C. The above coated film is washed with water and dried at 70° C. for 10 minutes to obtain a smooth photosensitive film having a thickness of 25μ.

Thereafter, a circuit pattern having a line width of 75 μm and a space width of 100 μm is set on the photo-sensitive film to be exposed to ultraviolet light irradiated in an irradiation dose of 100 mj/cm² by use of an ultra-high pressure mercury-vapor lamp. The exposed resist film is developed by use of an aqueous solution of 1% $Na_2CO_3$ as the developing solution. The developed pattern is then colored with a 0.1% aqueous solution of a water-soluble phthalocyanine dye. The 200 plates having the colored pattern are subjected to the same tests as in Example 1 with the result that 5 defectives are found in the visual circuit test and the circuit test respectively.

What is claimed is:

1. An improved method of forming a printed image in the preparation of a printed-circuit board by a process which comprises applying a photocurable electrodeposition coating composition onto a plate having a conductive film to form a photo-sensitive resist film thereon, and exposing the photo-sensitive resist film to light through a pattern mask to polymerize the coating where exposed to light, followed by development to remove the unexposed coating composition therefrom, the improvement comprising applying a dye to the surface of the photo-sensitive resist film after the application of the photo-curable electrodeposition coating to color the surface of said film.

2. A method as claimed in claim 1, wherein said dye is selected from azo dyes, anthraquinone dyes, indigoid dyes, magenta dyes, sulfide dyes, carbonium dyes, quinoneimine dyes and phthalocyanine dyes.

3. A method as claimed in claim 1, wherein said dye is selected from magenta dyes, quinoneimine dyes and phthalocyanine dyes.

4. A method as claimed in claim 1, wherein said dye is used at a concentration of 0.01 to 5%.

5. A method as in claim 1 wherein said dye is applied immediately after the formation of the photo-curable electrodeposition coating onto said plate.

6. A method as claimed in claim 5, wherein said dye is selected from azo dyes, anthraquinone dyes, indigoid dyes, magenta dyes, sulfide dyes, carbonium dyes, quinoneimine dyes and phthalocyanine dyes.

7. A method as claimed in claim 5, wherein said dye is selected from the magenta dyes, quinoneimine dyes and phthalocyanine dyes.

8. A method as claimed in claim 5 wherein said dye is used at a concentration of 0.01% to 5%.

9. A method as in claim 1, wherein said dye is applied directly to the surface of the photo-sensitive resist film after exposing the film to light.

10. A method as claimed in claim 9, wherein said dye is selected from azo dyes, anthraquinone dyes, indigoid dyes, magenta dyes, sulfide dyes, carbonium dyes, quinoneimine dyes and phthalocyanine dyes.

11. A method as claimed in claim 9, wherein said dye is selected from the magenta dyes, quinoneimine dyes and phthalocyanine dyes.

12. A method as claimed in claim 9, wherein said dye is used at a concentration of 0.01% to 5%.

13. A method as in claim 1, wherein said dye is applied to the surface of the exposed photo-sensitive resist film as a part of the developing solution.

14. A method as claimed in claim 13, wherein said dye is selected from azo dyes, anthraquinone dyes, indigoid dyes, magenta dyes, sulfide dyes, carbonium dyes, quinoneimine dyes and phthalocyanine dyes.

15. A method as claimed in claim 13, wherein said dye is selected from the magenta dyes, quinoneimine dyes and phthalocyanine dyes.

16. A method as claimed in claim 13, wherein said dye is used at a concentration of 0.01% to 5%.

17. A method as in claim 1, wherein said dyes is applied to the surface of the developed photo-sensitive resist after the completion of development.

18. A method as claimed in claim 17, wherein said dye is selected from azo dyes, anthraquinone dyes, indigoid dyes, magenta dyes, sulfide dyes, carbonium dyes, quinoneimine dyes, and phthalocyanine dyes.

19. A method as claimed in claim 17, wherein said dye is selected from the magenta dyes, quinoneimine dyes and phthalocyanine dyes.

20. A method as claimed in claim 17, wherein said dye is used at a concentration of 0.0% to 5%.

* * * * *